United States Patent [19]

Adams, Jr. et al.

[11] Patent Number: 4,684,955

[45] Date of Patent: Aug. 4, 1987

[54] MAXIMUM LIKELIHOOD ESTIMATION OF G/T OF SATELLITE EARTH TERMINALS USING EXTRATERRESTRIAL RADIO SOURCES

[75] Inventors: William C. Adams, Jr., Indialantic; Charles R. Patisaul, Melbourne, both of Fla.

[73] Assignee: Harris Corporation, Melbourne, Fla.

[21] Appl. No.: 673,412

[22] Filed: Nov. 20, 1984

[51] Int. Cl.⁴ .................... G01S 3/02; G01S 17/00; H04B 7/185

[52] U.S. Cl. .................................. 342/351; 342/352; 364/517; 364/455

[58] Field of Search ................ 343/351, 352, 5 NQ; 364/455, 515, 516, 517; 455/12, 25

[56] References Cited

U.S. PATENT DOCUMENTS 4,521,861 6/1985 Logan et al. .................... 343/451

OTHER PUBLICATIONS

M. Kanda, "An Error Analysis for Absolute Flux Density Measurements of Cas-A" IEEE Trans Instrumentation Measurement, vol. 25, No. 3, Sep. 1976, pp. 173–182.

Schwartz et al., "Communication Systems and Techniques", McGraw, 1966 pp. 85–90.

Watt, "Precision Measurement of Antenna System Noise Using Radio Stars" NBS, Boulder, Colorado, pp. 1–31.

Wait et al, "A Study of the Measurement of G/T Using Cassiopeia A", NBSIR 74-382, Boulder Colorado, Jun. 1974, pp. 9–12.

Proc. of the Society of Photo–Optical Instrumentation Engineers, Wash., D.C., Apr. 17-18, 1979, SPIE vol. 178, pp. 210-216, 219, 220.

Primary Examiner—Theodore M. Blum
Assistant Examiner—Gregory C. Issing
Attorney, Agent, or Firm—Antonelli, Terry & Wands

[57] ABSTRACT

To measure the figure of merit (G/T) and beam radial pointing error of a satellite earth station multiple Y-factor measurement are taken using a "drift cut" procedure and then these measurements are processed using a maximum likelihood estimate (MLE) algorithm. For carrying out the "drift cut" measurement process, the earth terminal's antenna is positioned such that the antenna beam intersects the path of the apparent star motion with a predetermined declination offset and ahead of the current star position. As the star position approaches the stationary antenna beam position, power measurements uniformly spaced in time are recorded. These power measurement "samples" are then divided by the "cold sky" power measurement to obtain corresponding Y-factor measurements. To eliminate the problem of antenna pointing error and star ephemeris error, multiple drift cuts are carried out, each offset in declination by a different amount from the estimate star declination, to produce a matrix of Y-factor values. This matrix of drift cut Y-factors is then processed using a maximum likelihood estimate algorithm, to provide MLE measures of that earth terminal's figure of merit and beam radial pointing error.

22 Claims, 11 Drawing Figures

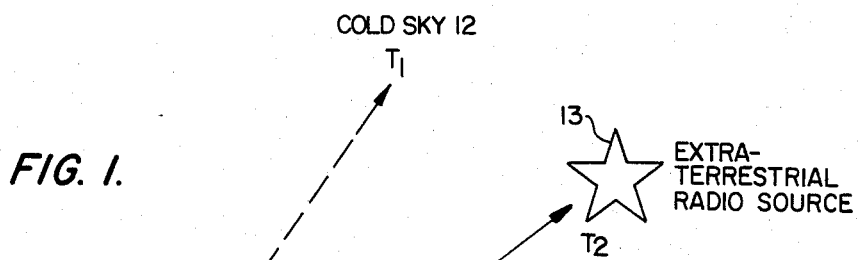
FIG. 1.
$$Y \triangleq \frac{kT_2B}{kT_1B} = \frac{T_2}{T_1} = \frac{T_1 + \Delta T}{T_1}$$
FIG. 3.
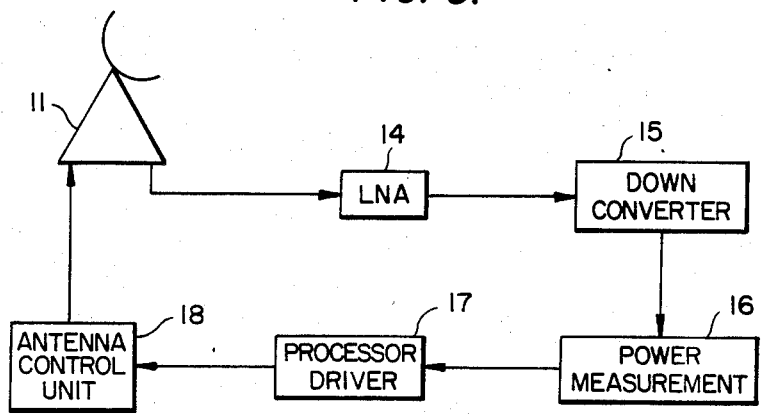

WHERE:
x = ALONG-TRACK AXIS
y = ACROSS-TRACK AXIS
z = Y-FACTOR VALUES

MAXIMUM LIKELIHOOD ESTIMATION OF G/T OF SATELLITE EARTH TERMINALS USING EXTRATERRESTRIAL RADIO SOURCES

FIELD OF THE INVENTION

The present invention relates, in general, to communication systems and is particularly directed to a mechanism for measuring the figure of merit (terminal gain (G)-to terminal system noise temperature (T) ratio) of a satellite earth terminal.

BACKGROUND OF THE INVENTION

A recurring important problem associated with production and evaluation of satellite earth terminals is the measurement, i.e. estimation, of the terminal figure of merit, G/T. One approach to determining G/T requires the separate evaluation of the terminal gain (G) and terminal system noise temperature (T), including sky noise, at a common reference point, usually the low noise amplifier (LNA) input, from which the ratio G/T may be computed. Although system noise temperature may be accurately estimated using hot/cold load measurements, accurate measurement of antenna gain using range measurements is considerably hampered by reflections, near-field effects, and the need for either a precisely characterized standard gain reference antenna or a calibrated RF signal source.

A more widely used approach for evaluating terminal G/T relies upon using extraterrestrial radio sources such as the sun, moon, and strong radio stars, e.g., Cassiopeia-A, Cygnus-A and Taurus-A, and inferring the G/T ratio from Y-factor measurements. Antenna gain can then be computed, if desired, from this ratio if system noise temperature is known.

Y-factor is typically obtained using a two step measurement process illustrated in FIG. 1. The terminal antenna 11 is first pointed at "cold sky" 12 and a measurement $P_1$ of the received power is obtained. The power level $P_1$ measured by aiming the antenna 11 at cold sky 12 includes terminal thermal noise and sky noise. A second power level $P_2$ is then measured by aiming the terminal antenna 11 at radio source 13. Power level $P_2$ includes terminal thermal noise, sky noise, and source noise.

These power levels can also be represented in terms of equivalent noise temperatures via the relationship $$P = kTB \qquad (1)$$

where P is noise power, k is Boltzmann's constant, T is noise temperature, and B is the measurement bandwidth. The figure of merit (G/T) of the satellite earth terminal may be derived from Y factor measurements, as follows. The Y factor is defined as:

$$Y = \frac{T + \Delta T}{T} \qquad (2)$$

where
T = terminal noise temperature plus sky noise temperature, and
$\Delta T$ = noise temperature of the extraterrestrial radio source.

The noise temperature of the source can be expressed as $$\Delta T = \Gamma S A / K \qquad (3)$$

where S is the flux density (W/m²/Hz) of the source, A is the effective aperture area of the antenna and $\Gamma$ is a constant accounting for effects such as atmospheric transmission, system bandwidth, polarization, etc. Effective aperture can be related to antenna gain and operating wavelength, $\lambda$, by $$A = \nu^2 G / 4\pi \qquad (4)$$

Thus $$\Delta T = \Gamma S \lambda^2 G / 4\pi k \qquad (5)$$

Substituting equation (5) into equation (2) and solving for G/T yields the desired connecting relationship between Y-factor and G/T, i.e.

$$G/T = \frac{4\pi k (Y - 1)}{\Gamma S \lambda^2} \qquad (6)$$

Now, although G/T is generally defineable by measurement determination, from a practical standpoint antenna aperture size will determine which extraterrestrial radio sources can be used for estimating G/T. For example, small-aperture, low-gain antennas cannot use radio star sources since the resulting measured Y-factor values are small relative to Y-factor measurement errors. These small-aperture terminals must use the sun or the moon as a radio source in order to achieve suitably large Y-factor values. When using the moon or the sun as a radio source, one must account for the following factors: (1) change in distance to the source with time; (2) changes in apparent angular extent of the source with time (this implies that the factor that accounts for the finite angular extent must be adjusted accordingly); and (3) changes in source flux density with time. These changes occur on a monthly (lunar cycle) basis for the moon source and on an annual basis for the sun source, except that solar flux density is a random variable and its value at a given time must be obtained from the National Bureau of Standards.

On the other hand, terminals employing large aperture antennas are well-suited for use with radio star sources since their large antenna gains yield large measured Y-factor values (several dB). As is the case for small antennas used with the sun or moon, the angular extent of the radio star source must be taken into account since the angular extent of the radio star may not be negligible with respect to the antenna beamwidth.

Between these two sizes are medium-aperture antennas which, unfortunately, are not well suited for use with the sun or moon as a radio source, since the medium aperture beamwidth is small compared to the angular extent of the sun or moon (approximately 0.5°). The resulting Y-factor measurements are not useful since the radiated flux density of the sun and the moon will vary depending upon which portion of the surface is being illuminated, i.e., examined, by the antenna. Furthermore, significant source flux may be captured by the antenna's side lobe structure. On the other hand, medium-aperture antennas yield small measured Y-factor values (tenths of dB) when a radio star is used as the extraterrestrial source. The result is that small Y-factor measurement errors significantly degrade the accuracy of the G/T estimate since the nominal Y-factor is small. The fact that G/T estimate errors increase when Y-factors become smaller and the measurement error remains the same is explained below.

From equation (6) it can be shown that $$\frac{\partial(G/T)}{\partial(Y)} dB = \frac{10^{(Y)dB/10}}{10^{(Y)dB/10} - 1} \quad (7)$$

so that $$(\Delta G/T)_{dB} = \frac{10^{(Y)dB/10}}{10^{(Y)dB/10} - 1} (\Delta Y)_{dB} \quad (8)$$

It is clear that Y-factor measurement errors in dB, $(\Delta Y)_{dB}$, are magnified by the factor $$m = \frac{10^{(Y)dB/10}}{10^{(Y)dB/10} - 1} \quad (9)$$

It is obvious that smaller nominal Y-factors (dB) imply larger G/T errors (dB) even though measurement error $(\Delta Y)_{dB}$ remains constant. The value of the Y-factor error magnification factor m is plotted versus nominal Y-factor in FIG. 2.

The characteristic plotted in FIG. 2 emphasizes constraints that affect an estimation of G/T for medium aperture antennas, i.e. (1) the sun and moon cannot be used as a radio source; (2) small nominal Y-factors result when radio stars are used as sources; and (3) Y-factor measurement error is fixed regardless of nominal Y-factor.

This G/T estimation problem is similar to the communication problem of detecting a weak signal embedded in additive noise. A single sample of signal-plus-noise may not permit the desired detection performance due to insufficient per-sample signal-to-noise ratio, $SNR_s$. However, the problem may be remedied by utilizing multiple (N) samples to determine whether the signal is present. The resulting performance is the same as if the effective SNR were $\sqrt{N}$ $SNR_s$. This is because the signal samples are coherent and the noise samples are incoherent. The same improvement can be obtained in estimating Y-factor since measurement errors are independent from one measurement to the next. Thus, one reasonable approach is to make multiple Y-factor measurements and compute the average Y-factor. This has the effect of reducing the effective measurement error by the factor $\sqrt{N}$.

In an ideal situation, one would have perfect knowledge of antenna location and star source position versus time, as well as the capability to point the antenna to a specified position without error. In this case, one would simply track the radio source perfectly and integrate the output of the power detection device; error due to Y-factor measurement could be made arbitrarily small by integrating over a sufficiently long interval.

In practice, of course, perfect tracking of the source is not possible. Instead, multiple Y-factor measurements are typically made by having an operator locate the star within the antenna beamwidth and manually steer the beam to "peak up" the power meter reading. This process is repeated until the desired number of "peak" Y-factor measurements have been made. This is a time-consuming, labor-intensive, error-prone, potentially inaccurate process that depends upon the skill of the operator. Typically, the highest and lowest Y-factor measurements are discarded from the data set prior to computing the average Y-factor; this is done to eliminate what are assumed to be, but are not necessarily, possible "bad" measurements.

SUMMARY OF THE INVENTION

In accordance with the present invention, shortcomings of the above process are eliminated by obtaining multiple Y-factor measurements through a "drift cut" procedure and then processing these measurements using a maximum likelihood estimate (MLE) algorithm. For carrying out the "drift cut" measurement process, the earth terminal's antenna is positioned such that the antenna beam intersects the path of the apparent star motion with a predetermined declination offset and ahead of the current star position. As the star position approaches the stationary antenna beam position, power measurements uniformly spaced in time (and, therefore, in angular separation) are recorded. These power measurement "samples" are then divided by the "cold sky" power measurement to obtain corresponding Y-factor measurements. To eliminate the problem of antenna pointing error and star ephemeris error, multiple drift cuts are carried out, each offset in declination by a different amount from the estimated star declination, to produce a matrix of Y-factor values. This matrix of drift cut Y-factors is then processed using a maximum likelihood estimate algorithm, to provide a measure of that earth terminal's figure of merit.

Unlike the prior art approaches of using star measurements for only large aperture terminals, the multiple drift cut/maximum likelihood estimation measurement technique provides a near real time, "best possible" G/T estimate for the earth terminal of interest.

BRIEF DESCRIPTION OF THE DRAWINGS

FIG. 1 is a diagram for illustrating the technique of measuring an earth station's Y-factor from an extraterrestrial radio source;

FIG. 3 is a block diagram of a satellite earth terminal power measurement/antenna control system;

DETAILED DESCRIPTION

Figure 2:
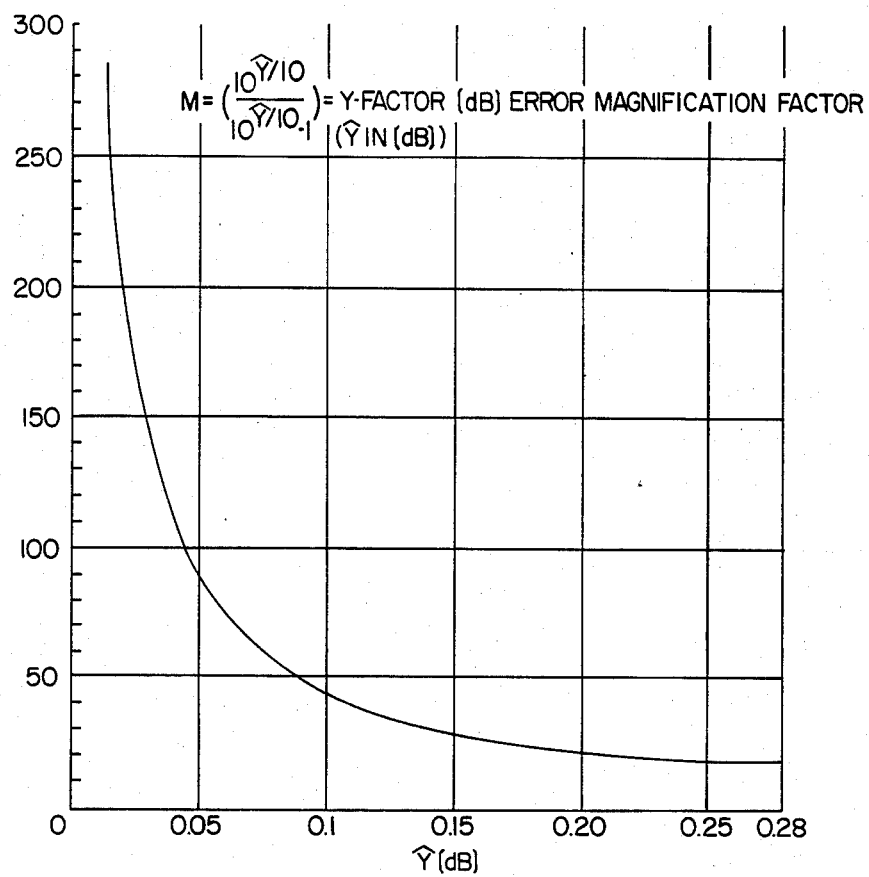
FIG. 2 is a graph showing a Y-factor error magnification factor characteristic.

To facilitate understanding of the present invention the following description will first explain the manner in which the Y-factor data to be processed is gathered (multiple "drift cut" antenna measurements) and then detail the application of the maximum likelihood estimate algorithm to such measurements.

Before describing, in detail, the particular improved G/T measurement scheme in accordance with the present invention, it should be observed that the present invention resides primarily in a process for controlling and processing signals produced by conventional satellite earth station hardware and associated computer circuits and not in the particular detailed configurations thereof. Accordingly, the structure, control, and arrangement of such hardware and computer circuits have been illustrated in the drawings by readily understandable block representations and schematic diagrams, which show only those specific details that are pertinent to the present invention, in order not to obscure the disclosure with structural details which will be readily apparent to those skilled in the art having the benefit of the description herein. In addition, the description of the software/flow chart operation of an electronic data processing system has been appropriately consolidated and simplified in order to emphasized those portions that are most pertinent to the present invention. Thus, the block diagram illustrations of the Figures do not necessarily represent the mechanical structural arrangement of the exemplary system, but are primarily intended to illustrate the major structural components of the system in a convenient functional grouping, whereby the present invention can be mode readily understood.

Referring now to FIG. 3, there is shown a block diagram of that portion of a typical satellite earth terminal through which Y-factor measurements are carried out. Monitored radio waves that are received by antenna 11 are coupled via a low noise amplifier 14 to a down converter 15, the output of which is coupled to a power meter to derive a measure of the power that is received by antenna 11 and including any effects of internal circuitry of the terminal. The output of power meter 16 is usually digitally formatted and buffered for processing at a remote site in order to determine the G/T of the satellite earth station. In accordance with the present invention however, because of the maximum likelihood estimate signal processing scheme employed, power meter data can be processed effectively in real time through the use of a conventional desk top microprocessor, shown as processor 17 in FIG. 1, programmed to execute the signal processing algorithms to be described in detail below. Processor 17 not only calculates G/T for the measured Y-factor data but also supplies control signals to an antenna control unit 18 for controlling the pointing of antenna 11.

I—Drift Cut Data Measurement Process

Figure 4:
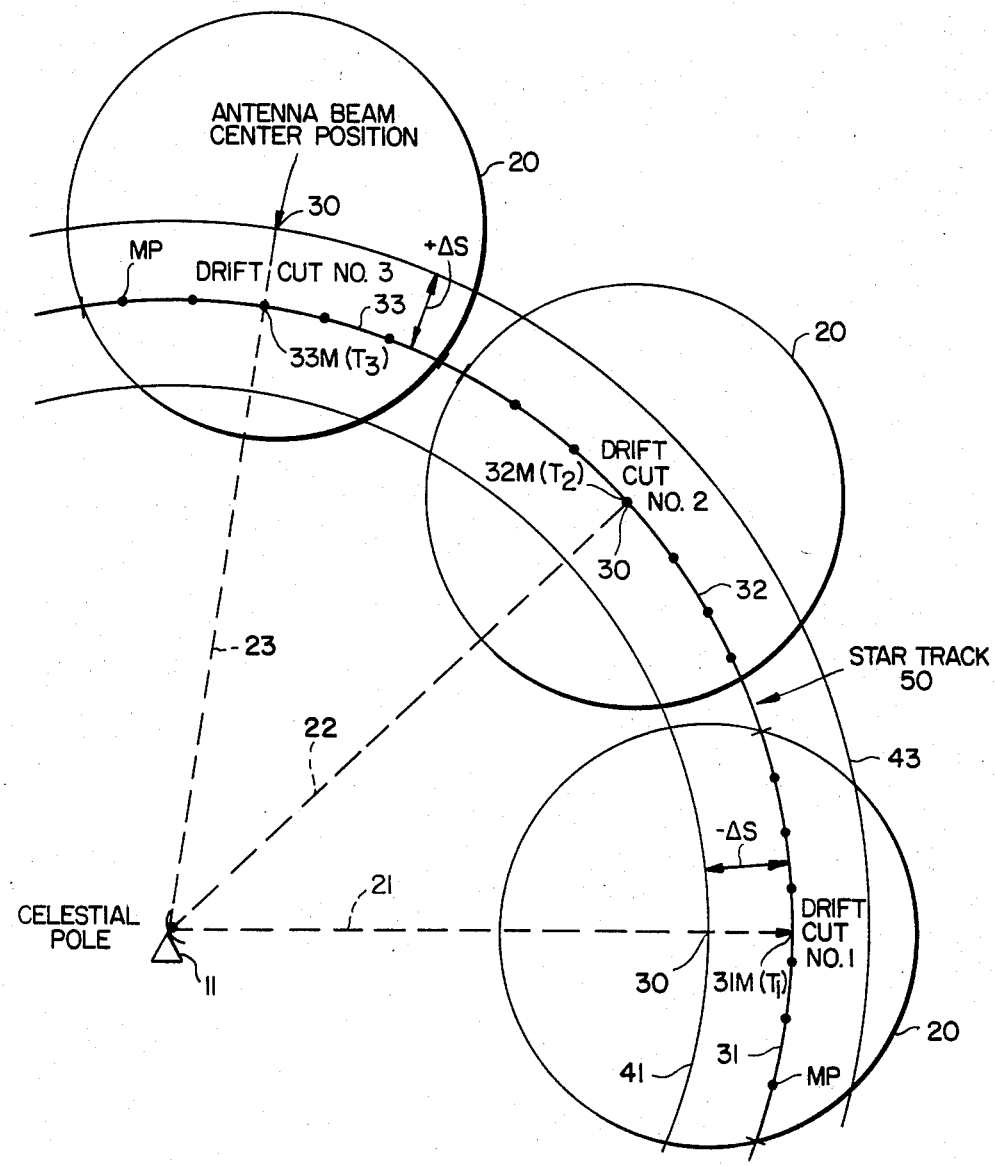
FIG. 4 shows a sequence of antenna beam positions for successive drift cuts of a star travel path.

As pointed out briefly above, the star drift cut technique avoids the antenna pointing errors associated with active tracking in which the antenna mechanical structure is continually moving (via autotrack or program track mode) in an attempt to follow an extraterrestrial radio source. A star drift cut is obtained by positioning the antenna beam in the path of the apparent star motion with a predetermined declination offset and ahead of the current star position. This is illustrated in FIG. 4 which shows three successive antenna center beam positions 21, 22, 23 and corresponding drift cuts 31, 32 and 33 in the course of the apparent movement of a star (extraterrestrial radio source) relative to an earth terminal 11. Because of static antenna pointing error and star ephemeris error, it cannot be assured that any of the Y-factor values to be derived along one of the drift cuts (e.g. 31, 32 or 33) corresponds to the point of maximum antenna gain. This problem is avoided by generating a matrix of Y-factor values from multiple drift cuts, each offset in declination by a different amount from the estimated star track 50. In FIG. 4 the aperture 20 of the antenna is shown as a circle having a center or boresight 30. For drift cut No. 1, the antenna beam is pointed in direction 21 such that the center or boresight 30 intersects a track 41 that is offset or declined by an amount $-\Delta s$ from the actual travel path 50 of the star. For drift cut No. 2, the antenna beam center 30 is shown as intersecting a track 42 that is substantially coincident with travel path 50, while, for drift cut No. 3, the beam center 30 intersects a track 43 that is offset by an amount $+\Delta s$ relative to star travel path 50. Of course, it is to be realized that the three drift cuts shown in FIG. 4 and the corresponding separation $+\Delta s$ are not to scale and do not constitute the total number of cuts employed, but are simplified for purposes of explanation and illustration.

For each drift cut, as the star position approaches the stationary antenna beam position, power measurements uniformly spaced in time (and, therefore, also in angular separation) and recorded. Star locations for these measurement points are illustrated in FIG. 4 by dots MP evenly distributed along star track drift cuts 31, 32 and 33.

As will be described below in conjunction with the explanation of the signal processing algorithm for the Y-factor data measurements, it is desired that the data points obtained from successive drift cuts be properly aligned to form a square matrix of Y-factor measurements. To accomplish this sampling, instants for successive drift cuts are preestablished using an antenna pointing procedure as follows.

First, a point in real time $T_1$ is selected to be the midpoint 31M of the first drift cut 31. The position of the star at $T_1$ is computed based on star data and the equivalent pointing direction 21 of the antenna boresight is determined. The antenna is then pointed such that the center 30 of beam aperture 20 is aligned with pointing direction 21. Data samples are taken at equally spaced time intervals on either side of $T_1$ as the star drifts through the beam aperture 20. For the next drift cut 32, a time $T_2$ is selected as the drift cut midpoint 32M. Star position and pointing direction 22 are computed, and the antenna is positioned such that center 30 of beam aperture 20 is aligned with pointing direction 22. Data samples are taken at equally spaced time intervals on either side of $T_2$. This sequence of events is repeated until drift cuts at all required offsets are obtained. (As pointed out above, FIG. 4 shows exaggerated star and antenna beam movement for three drift cuts taken according to the procedure just outlined.)

Figure 5:
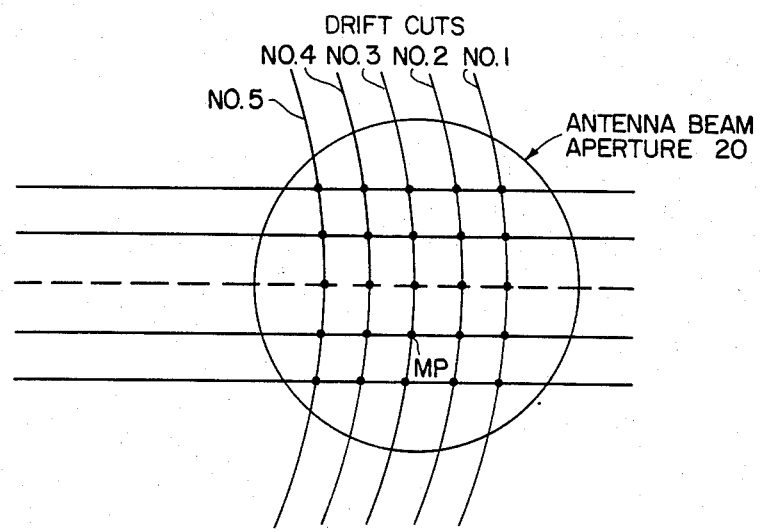
FIG. 5 shows a matrix of drift cut measurement lying within an antenna beam aperture.

Once all drift cuts have been taken, a data matrix is formed by aligning the midpoint samples of consecutive drift cuts, i.e., the samples taken at $T_1$, $T_2$, $T_3$, etc. Because of symmetrical time sampling on either side of the midpoints, the other data samples are automatically brought into alignment. A data matrix so assembled and its relationship to the antenna beam shape are depicted in FIG. 5. Neglecting the slight curvature of the drift cuts, the required square matrix has been obtained.

In order to implement drift cut measurements, it is necessary to compute antenna point direction (in terms of elevation and azimuth) corresponding to known equivalent rotation angle $\omega t$ and declination offset. The equivalent rotation angle $\omega t$ may be defined in terms of Hour-Angle (HA). The necessary mathematical algorithm is detailed below.

Figure 6:
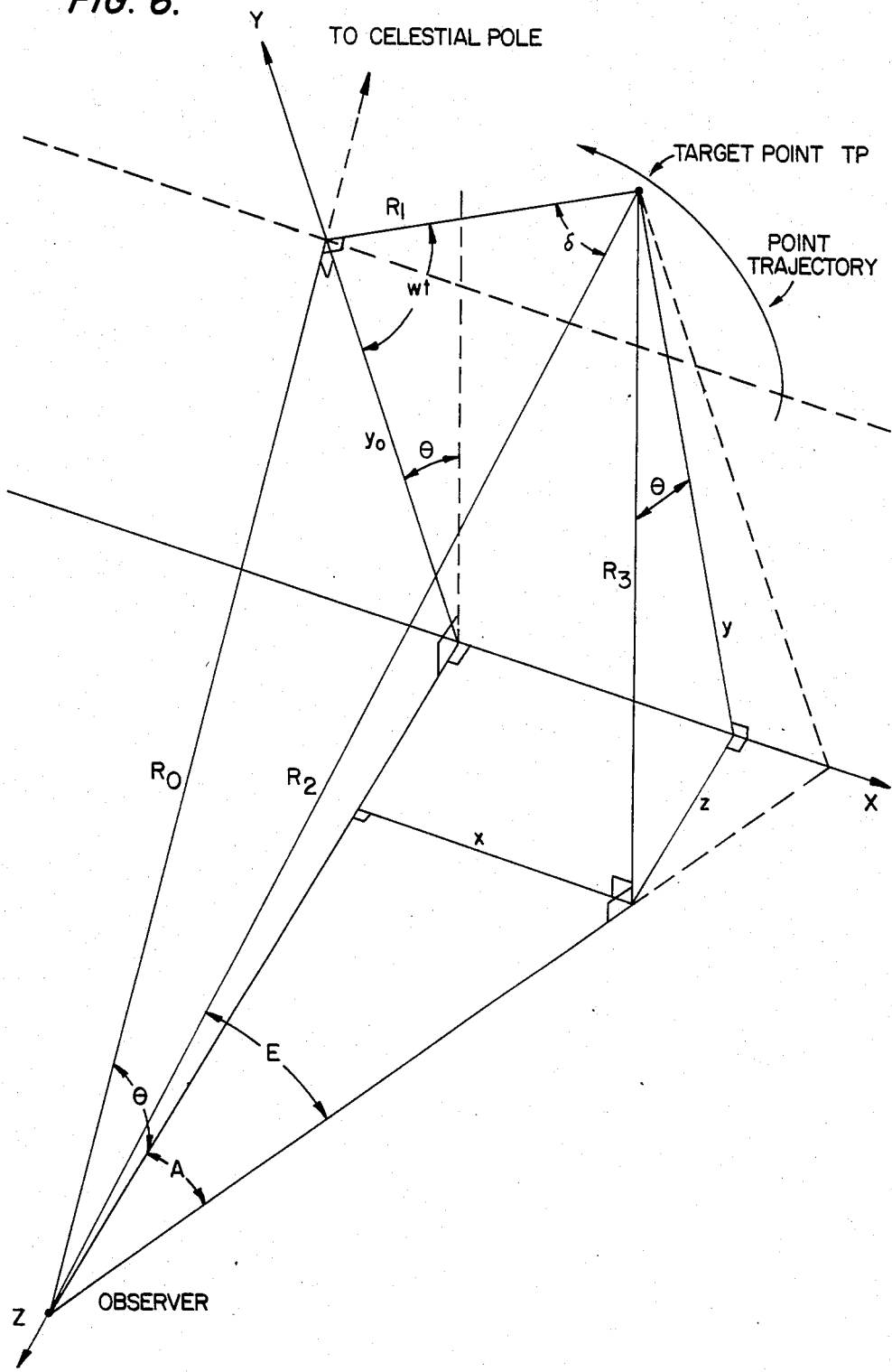
FIG. 6 is a diagram of a geometrical framework for determining azimuth and elevation to an antenna target point.

The geometrical framework for pointing in azimuth and elevation to a target point on a circle in the XY viewing plane is shown as FIG. 6. The target point TP may represent either the star 13 or a desired antenna beam center 30 for a drift cut. Recall that the viewing plane is perpendicular to the observer's line of sight to the celestial north pole. FIG. 6 represents the case of a northern hemisphere observer pointing to a position whose declination is greater than the observer's geodetic latitude; this implies that the star track viewing plane lies in front of the observer as he faces north.

In FIG. 6, $\theta$ is the elevation of the celestial north pole at the observer's location, $\delta$ is the declination of the target point, $\omega t$ is the rotational angle of the target point, A is the observer's azimuth to the target point and E is the observer's elevation to the target point. From the graphic relationship shown:

$$x(t) = (R_0/\tan\delta) \sin\omega t \quad (10)$$

$$y(t) = R_0 \tan\theta - (R_0/\tan\delta) \cos\omega t \quad (11)$$

Azimuth as a function of time is formed as follows:

$$\tan A(t) = \frac{x(t)}{(R_0/\cos\theta) - z(t)} \quad (12)$$

$$z(t) = y(t) \sin\theta \quad (13)$$

$$\tan A(t) = \frac{(R_0/\tan\delta) \sin\omega t}{(R_0/\cos\theta) - [R_0 \tan\theta - (R_0/\tan\delta) \cos\omega t] \sin\theta} \quad (14)$$

$$\tan A(t) = \frac{\cos\theta \sin\omega t}{\tan\delta(1 - \tan\theta \cos\theta \sin\theta) + \sin\theta \cos\theta \cos\omega t} \quad (15)$$

$$\tan A(t) = \frac{\cos\theta \sin\omega t}{\tan\delta(1 - \sin^2\theta) + \sin\theta \cos\theta \cos\omega t} \quad (16)$$

$$A(t) = \tan^{-1}\left[\frac{\sin\omega t}{\cos\theta \tan\delta + \sin\theta \cos\omega t}\right] \quad (17)$$

For elevation as a function of time $$\sin E(t) = R_3/R_2 \quad (18)$$

$$R_3 = y(t) \cos\theta \quad (19)$$

$$R_2 = R_0/\sin\delta \quad (20)$$

$$\sin E(t) = \frac{[R_0 \tan\theta - (R_0/\tan\delta) \cos\omega t] \cos\theta}{(R_0/\sin\delta)} \quad (21)$$

$$\sin E(t) = \sin\delta \tan\theta \cos\theta - (\sin\delta/\tan\delta)\cos\theta \cos\omega t \quad (22)$$

$$E(t) = \sin^{-1}[\sin\delta \sin\theta - \cos\delta \cos\theta \cos\omega t] \quad (23)$$

Equations 17 and 23 give pointing azimuth and elevation when target point declination $\delta$ and rotation $\omega t$ are known. It should be noted that the capability to compute elevation and azimuth corresponding to any specified declination and rotation (i.e. hour angle) may be inherent in the terminal.

Figure 7:
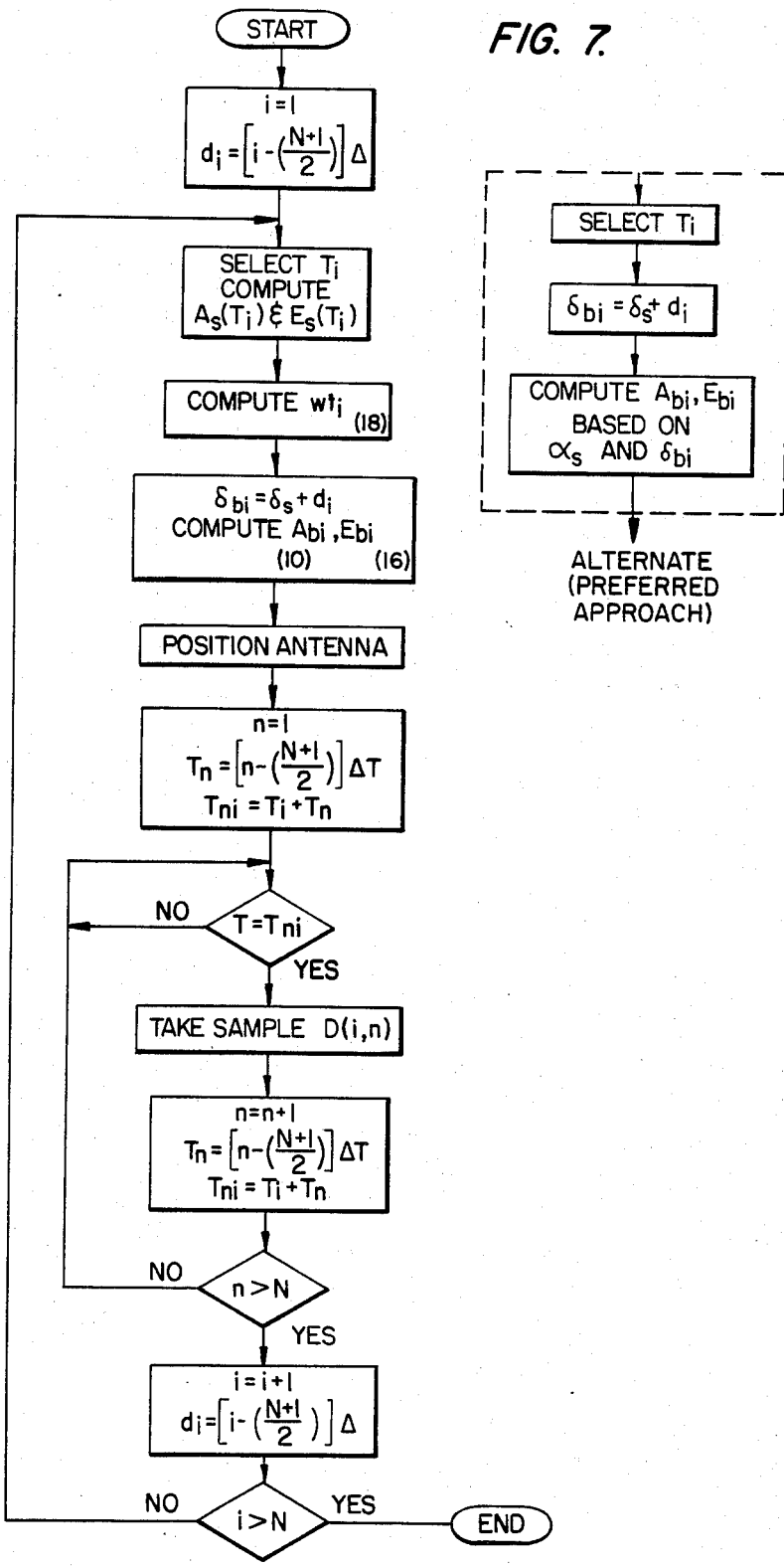
FIG. 7 is a flow chart of an algorithm for the aiming of the antenna and data acquisition of an earth station.

The algorithm for antenna pointing and drift cut data taking is summarized in flow chart form in FIG. 7. The variables are defined below.

N: dimension of desired Y-factor data matrix (NXN), N odd
i: drift cut index
n: along-track data point index
$\Delta$: angular spacing of data points along track and cross track
$d_i$: cross-track angular offset of $i^{th}$ drift cut
T: real time
$T_i$: time corresponding to midpoint of $i^{th}$ drift cut
$\Delta T$: time interval corresponding to $\Delta$ along-track angular travel of star
$A_s(t)$: star azimuth at midpoint of $i^{th}$ drift cut
$E_s(t_1)$: star elevation at midpoint of $i^{th}$ drift cut
$\delta_s$: star declination
$\alpha_s$: right ascension of star
$A_{bi}$: antenna beam azimuth for $i^{th}$ drift cut
$E_{bi}$: antenna beam elevation for $i^{th}$ drift cut
$\delta_{bi}$: antenna beam (i.e., target point) declination for $i^{th}$ drift cut
$\omega t_i$: rotation angle for midpoint of $i^{th}$ drift cut
$T_n$: time offset for $n^{th}$ data point in drift cut
$T_{ni}$: sample time for $n^{th}$ data point in drift cut
$D(i,n)$: data value for $n^{th}$ point in $i^{th}$ drift cut As pointed out above because each successive drift cut is offset from the previous drift cut, for successive power measurements at star positions MP, there is obtained a matrix of Y-factor values associated with corresponding star locations along successive drift cuts as viewed by the aperture 20 of the antenna beam. Namely, the two-dimensional array Y-factor corresponds to a two-dimensional spatial, i.e. angular, sampling of the antenna response profile, as shown in FIG. 5. It should be noted that the peak of the antenna response profile may not correspond to any of the power measurement points MP. However, as will be explained below, this does not necessarily constrain the performance of the MLE G/T estimation process.

II—Y-Factor Data Processing

Using the matrix of Y-factor data obtained through the above described multiple drift cut process, the signal processing scheme of the present invention proceeds to process the data using a maximum likelihood estimation algorithm that produces a best estimate of true peak Y-factor and, consequently, G/T. In order to afford a complete appreciation of the success of this signal processing scheme to produce a best estimate of G/T, the manner in which the MLE processing algorithm was developed will be explained.

Figure 8:
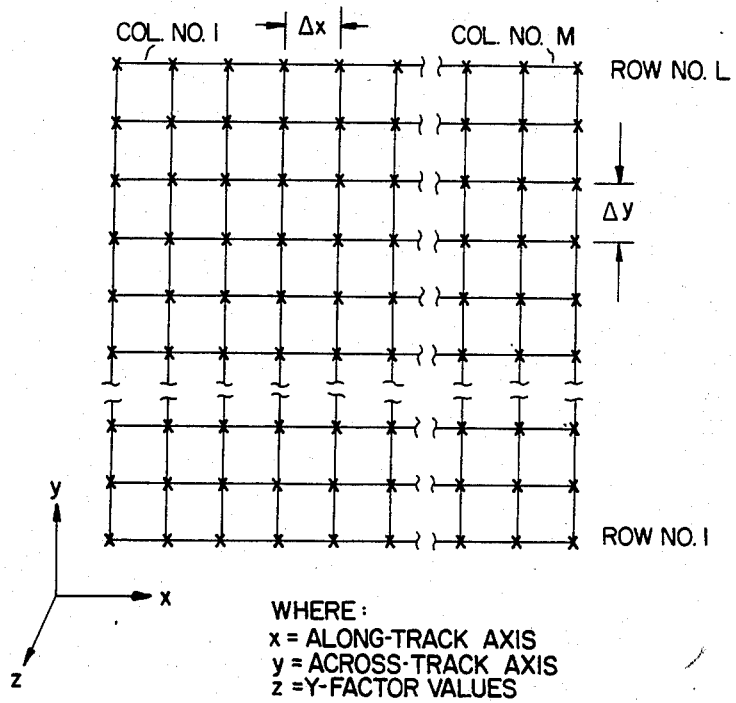
FIG. 8 is a rectangular coordinate graph of measured Y-factor data.

Referring to FIG. 8, there is shown a matrix of measured values representing the Y-factor measurements uniformly spaced in both dimensions of an orthogonal, rectilinear coordinate system: x—along-track angular displacement, y=across-track angular displacement, z=Y-factor value, as shown. The slight curvature of each drift cut has been determined to be effectively negligible. Errors in Y-factor measurements are assumed to be Gaussian, and no a priori knowledge is assumed regarding the magnitude of peak Y-factor. Furthermore, the position of peak Y-factor is assumed equally likely to be anywhere within the search region. In addition, errors due to initial antenna pointing error at the beginning of each drift measurement were neglected, and the position of the peak Y-factor value was assumed to lie within a predetermined subregion centered within the Y-factor data matrix. Also, both star flux density and antenna beamshape are assumed to be radially symmetric. The MLE G/T estimation algorithm for processing the Y-factor in accordance with the present invention was developed for the ideal case represented by the above assumptions.

As pointed out above, the matrix of Y-factor values is assumed to be corrupted by additive Gaussian measurement errors, and from this noisy data an estimate of the peak Y-factor to be obtained. In addition to measured Y-factor values there is also an a priori knowledge of the shape of the "signal" if measurement errors were not present. Although the "signal" in this case is a two-dimensional surface having the shape of the antenna response, the principles of optimum detection from communication theory are applicable. A maximum likelihood estimation (MLE) procedure is employed to compute the most probable value of peak Y-factor; no other procedure can yield better performance. The MLE is also known as the maximum a posteriori (MAP) estimate.

The Y-factor peak position is assumed to lie within a subregion centered in the Y-factor data matrix. The availability of additional data outside the subregion leads to a simpler MLE structure and, moreover, improves the MLE performance, especially when the true peak position is near an edge of the subregion.

Figure 9:
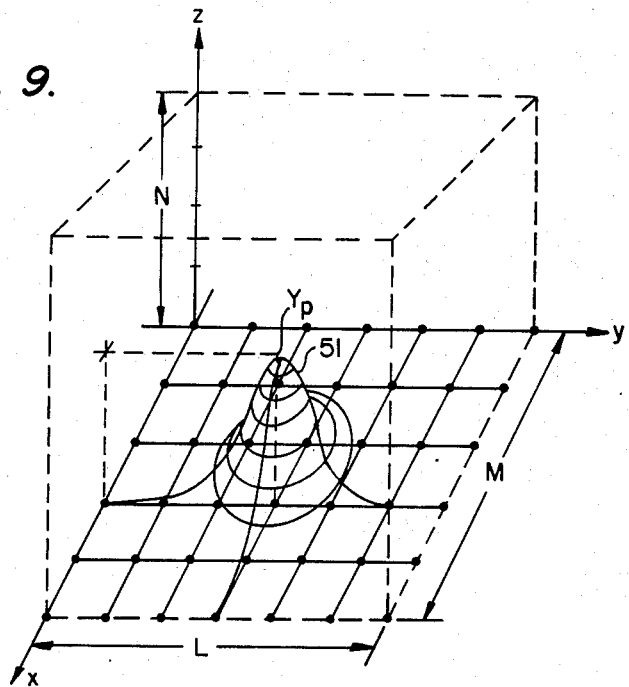
FIG. 9 is a three dimensional representation of terminal signal response within a matrix of data sample points.

The MLE may be thought of as follows: The "source" (here, star 13) transmits one of a number of possible "signals" to the receiver (earth terminal 11), which receives the "signal" corrupted by additive Gaussian noise (additive measurement errors). The particular "signal" transmitted is identified by the XY position of its peak and the Z value of the peak. The "signal" in this case is Y-factor where $Y=(S+N)/N=1+S/N$. By subtracting unity from each Y-factor, it is converted to S/N. Henceforth, $S/N=Y-1$ will be considered as the "signal". As shown in FIG. 9, this "signal" is two-dimensional in character and may be illustrated as a surface 51 above an XY plane in that the "signal"$=s=f(x,y)=z$. In the absence of measurement noise, the surface has the same smooth shape as the antenna response to the nonpoint source star 13. Measurement noise results in a "bumpy" surface.

If the position of the Y-factor peak $Y_P$ is considered to correspond to one of the LxM Y-factor data positions in the matrix subregion and the peak value is quantized to one of N levels, then the problem reduces to deciding which one of LxMxN possible discrete "signals" was transmitted, based upon noisy data.

It should be noted that for the special case in which no a priori knowledge regarding transmitted signal is available (specifically, the probability density function (pdf) of transmitted signal is uniform throughout the signal space), a least-squares fit of a signal replica to observed data also yields the MLE solution. On the other hand, when the a priori pdf is known and nonuniform, the MLE procedure yields better performance than least-squares fit of a signal replica to observed data.

The sufficient statistic $R_{ij}$ for the general problem is well known and given by:

$$R_{ij} = \int\int D(x,y)\,[\rho_i M_j(x,y)]\,dxdy - \frac{1}{2}\int\int [\rho_i M_j(x,y)]^2 dxdy +$$

$$\frac{N_o}{2}(\ln p_{ij})$$

for i=1,2 ... N (magnitude index)
j=1,2 ... LM (position index)

where

D(x,y)=observed values (Y−1)

$\rho_i M_j(x,y)$=signal replica at $j^{th}$ position with $\rho_i$ magnitude (note separability property, since the "mask" $M_j(x,y)$ has unit peak value) (24)

$M_j(x,y)$=the correlation mask consisting of a unity amplitude two-dimensional signal replica at the $j^{th}$ position of the signal space matrix (FIG. 8), where j=1,2 ..., LM.

$\rho_i$=value corresponding to the $i^{th}$ signal signal strength hypothesis, i=1,2 ..., N.

The maximum likelihood estimate as to which "signal" was transmitted is obtained by evaluating all LMN sufficient statistics $R_{ij}$ and choosing the largest.

The optimality of the above sufficient statistic and decision rule requires that the measurement noise process be additive, white, and Gaussian. In a discrete, sampled data system such as this one, the whiteness requirement is satisfied if the measurement error samples are uncorrelated.

The expression of $R_{ij}$ may be simplified since all hypotheses are assumed equilikely, i.e., $$P_{ij} = \frac{1}{LMN}$$

(constant), and $\rho_i$ does not depend upon position (j index).

The fact that $\rho_i$ is independent of position implies that $R_{ij}$ value may be maximized over j, then over i independently. The result of this separability is the presence of two sequential MLE problems. It may be solved by first finding the MLE of XY position of the signal, and then finding the MLE of the height of the signal. Thus, the first problem involves a MLE "signal" peak position search over LxM points, and the second problem involves a MLE "signal" peak height search over N points.

The recognition of the separability of the MLE problem is one of the two key features of the present invention. It greatly reduces the required quantity of computation and permits the MLE of G/T to be accomplished in near-real time using only a desk top microcomputer. The other key feature of the present invention is the treatment of the peak signal response as a continuous quantity $\rho$ rather than a discrete quantity $\rho_i$; this aspect of the problem will be discussed below.

The problem is thus reduced to $$R_{ij} = \rho_i \int\int D(x,y)\,M_j(x,y)\,dxdy - \frac{\rho^2_i}{2}\int\int M_j^2(x,y)\,dxdy \qquad (25)$$

Since the second double integral is a constant, say E, independent of j, the result becomes $$\xi_i = \underset{j}{\max} R_{ij} = \rho_i \underset{\underbrace{j}_{C}}{\max} \int\int D(x,y)\,M_j(x,y)\,dxdy - \rho_i^2 \frac{E}{2} \qquad (26)$$

Figure 10:
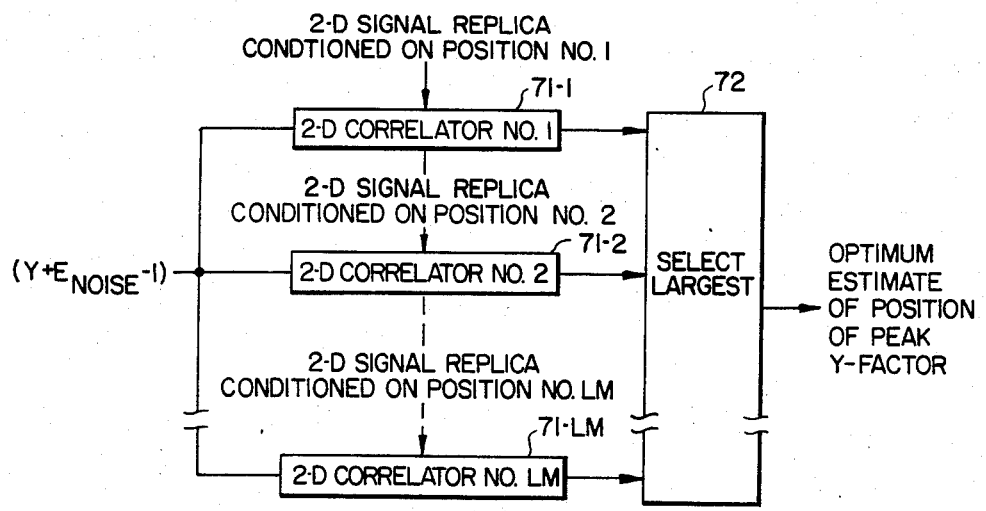
FIG. 10 shows a signal processing scheme for implementing a maximum likelihood estimation of peak Y-factor position in a Y-factor data matrix.

It can be shown that the maximization of the remaining double integral over all possible XY positions, i.e., over the range of the j index, is equivalent to finding the MLE of location of peak Y-factor. A signal processing scheme corresponding to the MLE procedure for peak position location is shown in FIG. 10 as comprising a plurality LM of two-dimensional correlations 71-1, 71-2 ... 71-LM one input of each of which corresponds to the Y-factor plus noise signal $Y+E_{noise}-1$. A second input of each correlation function is a two dimensional signal replica (correlation mask) at one of the LM respective positions of the signal space matrix of FIG. 8. Each of the resulting correlations is examined to determine which is largest (step 72) and corresponds to an optimum estimate of the position of the peak Y-factor. The difference between the MLE estimate of the position of peak Y-factor and its predicted position (based upon known locations of the terminal and radio source) provides an MLE of antenna boresight pointing error.

Since the MLE of peak location has been found, it is only necessary to determine a maximum likelihood estimation of S/N level at that position. The resulting expression to be maximized is:

$$\xi_i = \rho_i C - \rho_i^2 \frac{E}{2}, i = 1,2,\ldots N \quad (27)$$

where C and E are previously defined constants.

As is clear from equation (27) the error of the MLE of signal-to-noise ratio decreases as N increases, i.e. as the quantization of the discrete variable $\rho_i$ becomes increasingly fine. In the limit as N approaches infinity, with the hypothesized range of $\rho_i(\rho_1$ to $\rho_N)$ being held constant, we may replace the discrete variable $\rho_i$ in equation (27) with the continuous variable $\rho$. The resulting continuous expression may then be differentiated to determine the value of $\rho$ for which $\xi$ is maximum. This value of $\rho$ is the MLE of $\rho$, $\hat{\rho}$, from which the MLE of Y is obtained. The result of being able to treat the peak signal strength as a continuous quantity rather than a discrete quantity is that the required amount of computation is reduced. The value of $\rho$ that maximizes the sufficient statistic is the quotient of two previously-computed quantities as shown below.
Using $$\frac{\partial \xi}{\partial \rho} = C - \rho E = 0, \quad (28)$$

therefore $$\hat{\rho} = C/E$$

where $\hat{\rho}$ = MLE of peak $(Y-1)$ and $$\hat{Y}_{peak} = \hat{\rho} + 1$$

Summarizing, once the position of the peak Y-factor has been found via two-dimensional correlation, the maximum likelihood estimate of peak Y-factor is obtained by computing $$\hat{Y} = 10 \log_{10}(1+\rho) \text{ in dB} \quad (29)$$

where $$\hat{\rho} = \frac{\iint_{R_D} D(x,y) M(x,y) \, dx \, dy}{\int_{R_M} M^2(x,y) \, dx \, dy} \quad (30)$$

$D(x,y)$ = matrix of measured $(Y-1)$ values,
$M(x,y)$ = matrix of correlation mask values corresponding to a two-dimensional unity-amplitude signal replica,
$R_D$ = data subregion centered on MLE estimate of peak Y-factor position, and
$R_M$ = correlation mask region.

Since both mask and data have equal sampling intervals in both dimensions, the estimated position must coincide with one of the data value positions.

Figure 11:
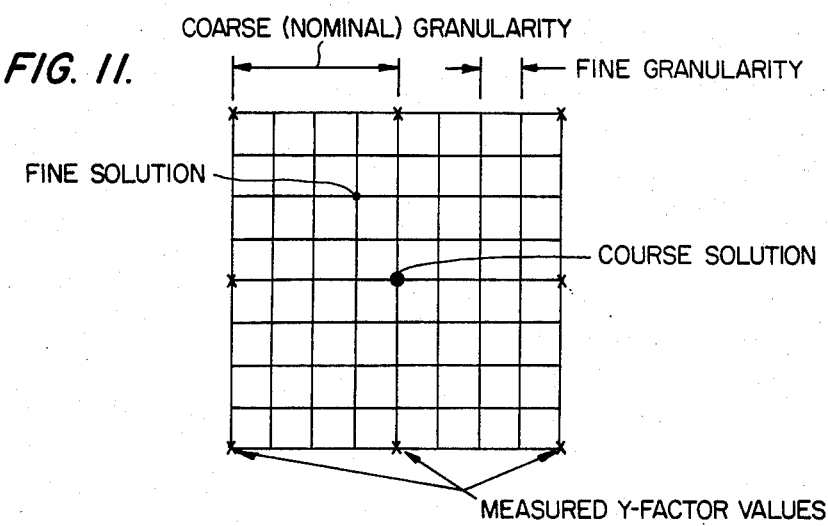
FIG. 11 shows the positions of coarse and fine correlation solutions for a matrix of measured Y-factor values.

If higher position resolution is required, a coarse/fine correlation approach can be used. This approach initially uses a mask with the same sampling granularity as the data matrix to choose one of the data positions assumed to be the location of the peak. Once this coarse position is known, a correlation mask with much finer sampling granularity is used in the immediate neighborhood of the coarse position to obtain a more precise estimate of peak Y-factor location. This coarse/fine correlation technique is illustrated in FIG. 11. This technique effectively removes the constraints of discreteness of peak position and of the peak position corresponding exactly to a Y-factor data point.

In the foregoing description of the application of the MLE technique from communications theory to the problem of G/T estimation for an "ideal" ground terminal, the accuracy of the G/T MLE is limited only by the measurement errors that are intrinsic to estimating parameters, e.g., power, of a random noise process.

Two other sources of estimation error that arise in practical (nonideal) situations are antenna pointing error and mismatch between the actual antenna beamwidth and the antenna beamwidth used to compute the correlation mask used in the MLE. These two error sources uniquely affect the MLE accuracy, whereas other error sources such as gain variation, atmospheric attenuation uncertainty, etc., are common to both the more conventional G/T estimation techniques and the MLE approach. Computer simulations show that the impact of typically encountered values of these errors in antenna boresight pointing and beam width mismatch, in the results obtained in accordance with the inventive MLE technique describe above, is negligible.

In implementing MLE procedure described above for a medium sized antenna earth terminal, all of the software for the estimation algorithm, as well as star emphemeris and antenna point, preferably resides in a single desk top microcomputer, shown as processor 17, in FIG. 1. The procedure runs essentially in real time. In other words, the time required for a G/T measurement is dominated by the time required to collect a set of Y-factor measurements, which in turn is determined by the drift rate of the star and the size of the data matrix.

The evaluation of the MLE technique of the present invention using a 38-foot antenna and Cassiopeia-A at 7.5 GHz indicates a measurement consistency and repeatability heretofore impossible to achieve using other approaches. Using a 9×9 data matrix, a 5×5 subregion and 0.01 degree sample spacing has yielded a standard deviation on the order of 0.005 dB in observed peak Y-factors for Y-factors in the vicinity of 0.25 dB. The observed standard deviation in repeated G/T estimates is approximately 0.06 dB; this larger value is due to the Y-factor error magnification factor m defined in equation (9).

While we have shown and described an embodiment in accordance with the present invention, it is understood that the same is not limited thereto but is susceptible of numerous changes and modifications as known to a person skilled in the art, and we therefore do not wish to be limited to the details shown and described herein but intend to cover all such changes and modifications as are obvious to one of ordinary skill in the art.

What is claimed:

1. For use in a communication system, a method of generating an indication from which the figure of merit of receiver equipment employed by said system may be derived comprising the steps of:
   (a) directing a signal gathering element of said receiver equipment along the track of a remote signal source and measuring the level of signals received at successive instances in time so a to produce therefrom a matrix of signal level measurements as encompassed by the signal gathering aperture of said signal gathering element;
   (b) processing said matrix of signal level measurements produced in step (a) to obtain a matrix of prescribed parameter values arrayed within the beam aperture of said signal gathering elements;
   (c) determining the maximum likelihood estimate of the position of the peak prescribed parameter value with said matrix; and
   (d) determining the maximum likelihood estimate of the magnitude of the peak prescribed parameter value of said matrix of prescribed parameter values based upon the maximum likelihood estimate of the position of the peak prescribed parameter value determined in step (c).

2. A method according to claim 1, wherein said prescribed parameter corresponds to Y-factor.

3. A method according to claim 1, wherein said signal gathering element comprises a radio wave receiving antenna, said remote signal source comprises an astronomical radio wave source and step (a) comprises directing said antenna at successive positions along the apparent travel track of said astronomical radio wave source such that the beam aperture of said antenna is directed at respectively different declinations relative to said track and, at each of said positions, measuring the level of signals received for successive locations of said astronomical radio wave source along said track within the beam aperture of said antenna, to thereby produce from the measured levels of signals said matrix of signal level measurements.

4. A method according to claim 3, wherein at respective positions for which successive signal level measurements are carried out for successive locations of said astronomical radio source along said track, the effective spacing between adjacent ones of said successive locations is the same.

5. A method according to claim 4, wherein the instances in time, at which said signal level measurements are carried out for the respective different declinations of said antenna, are such that the successive locations of said astronomical radio source along said track as viewed by said beam aperture are readily aligned with one another to form a matrix of effective star track locations within the beam aperture of said antenna.

6. A method according to claim 3, further comprising the step of (e) adjusting said matrix of signal level measurements to compensate for errors in the successive positions at which the beam of said antenna is directed.

7. A method according to claim 3, wherein step (b) includes processing said matrix of signal level measurements in accordance with the size of the beam aperture of said antenna.

8. A method according to claim 3, wherein said prescribed parameter corresponds to Y-factor.

9. A method according to claim 8, further including the step of:
   (e) providing a maximum likelihood estimate of antenna boresight pointing error in accordance with the difference between the maximum likelihood estimate of the position of the peak Y-factor value determined in step (c) and its predicted position.

10. For use in a communication system, a method of generating an indication of the pointing error in the operation of a signal gathering element of receiver equipment employed by said system comprising the steps of:
    (a) directing a signal gathering element of said receiver equipment along the track of a remote signal source and measuring the level of signals received at successive instances in time so as to produce therefrom a matrix of signal level measurements as encompassed by the signal gathering aperture of said signal gathering element:
    (b) processing said matrix of signal level measurements produced in step (a) to obtain a matrix of prescribed parameter values arrayed within the beam aperture of said signal gathering element;
    (c) determining the maximum likelihood estimate of the position of the peak prescribed parameter value within said matrix; and
    (d) providing a maximum likelihood estimate of said pointing error in accordance with the difference between the maximum likelihood estimate of the position of the peak prescribed parameter value determined in step (c) and its predicted position.

11. A method according to claim 10, wherein said prescribed parameter corresponds to Y-factor.

12. A method according to claim 11, wherein said signal gathering element comprises a radio wave receiving antenna, said remote signal source comprises an astronomical radio wave source and step (a) comprises directing said antenna at successive positions along the apparent travel track of said astronomical radio wave source such that the beam aperture of said antenna is directed at respectively different declinations relative to said track and, at each of said positions, measuring the level of signals received for successive locations of said astronomical radio wave source along said track within the beam aperture of said antenna, to thereby produce from the measured levels of signals said matrix of signal level measurements.

13. A method according to claim 12, wherein step (b) includes processing said matrix of signal level measurements in accordance with the size of the beam aperture of said antenna.

14. For use with a satellite communication system, a method of generating an indication from which the figure of merit, terminal gain-to-terminal system noise temperature, of a satellite earth station may be derived, comprising the steps of:
    (a) directing a radio wave receiving antenna of said earth station at successive positions along the apparent motion track of an astronomical radio wave source such that the beam aperture of said antenna is directed at respectively different declinations relative to said track;

(b) at each of said successive positions, measuring the level of signals received by said antenna for sequential locations of said astronomical radio wave source along said track within the confines of the beam aperture of said antenna;

(c) assembling said measured signal levels into a matrix of signal levels, a first coordinate axis of which effectively corresponds to the direction of said track, and a second coordinate axis of which effectively corresponds to the direction of the declination of the beam relative to said track;

(d) processing such matrix of signal levels assembled in step (c) to obtain a matrix of prescribed parameter values effectively arrayed within the beam aperture of said antenna;

(e) determining the maximum likelihood estimate of the position of the peak prescribed parameter value within said matrix; and (f) determining the maximum, likelihood estimate of the magnitude of the peak prescribed parameter value of said matrix of prescribed parameter values based upon the maximum likelihood estimate of the position of the peak prescribed parameter value determined in step (e).

15. A method according to claim 14, wherein said prescribed parameter corresponds to Y-factor.

16. A method according to claim 14, wherein adjacent ones of the sequential locations of said astronomical radio wave source along said track are effectively equally spaced apart from one another.

17. A method according to claim 14, wherein the instances in time, at which said signal level measurements are carried out for the respective different declinations of said antenna, are such that the successive locations of said astronomical radio source along said track as viewed by said beam aperture are readily aligned with one another to form a matrix of effective star track locations within the beam aperture of said antenna.

18. A method according to claim 14, wherein adjacent ones of the sequential locations of said astronomical radio wave source along said track are effectively equally spaced apart from one another.

19. A method according to claim 18, wherein the instances in time, at which said signal level measurements are carried out for the respective different declinations of said antenna, are such that the successive locations of said astronomical radio source along said track as viewed by said beam aperture are readily aligned with one another to form a matrix of effective star track locations within the beam aperture of said antenna.

20. A method according to claim 14, further comprising the step of (g) adjusting said matrix of signal levels to compensate for errors in the successive positions at which the beam of said antenna is directed.

21. A method according to claim 20, wherein step (d) includes processing said matrix of signal levels in accordance with the size of the beam aperture of said antenna.

22. A method according to claim 15, further including the step of (g) providing a maximum likelihood estimate of antenna boresight pointing error in accordance with the difference between the maximum likelihood estimate of the position of the peak Y-factor value determined in step (e) and its predicted position.

* * * * *